US009755335B2

(12) United States Patent
Rathburn

(10) Patent No.: US 9,755,335 B2
(45) Date of Patent: Sep. 5, 2017

(54) LOW PROFILE ELECTRICAL INTERCONNECT WITH FUSION BONDED CONTACT RETENTION AND SOLDER WICK REDUCTION

(71) Applicant: HSIO Technologies, LLC, Maple Grove, MN (US)

(72) Inventor: James J. Rathburn, Maple Grove, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 0 days.

(21) Appl. No.: 15/062,138

(22) Filed: Mar. 6, 2016

(65) Prior Publication Data
US 2016/0276763 A1    Sep. 22, 2016

Related U.S. Application Data

(60) Provisional application No. 62/134,810, filed on Mar. 18, 2015, provisional application No. 62/146,550, filed on Apr. 13, 2015.

(51) Int. Cl.
*H01R 12/00* (2006.01)
*H01R 12/70* (2011.01)
(Continued)

(52) U.S. Cl.
CPC ..... *H01R 12/7076* (2013.01); *H01R 12/7082* (2013.01); *H01R 13/405* (2013.01);
(Continued)

(58) Field of Classification Search
CPC ... H01L 23/4985; H01L 25/105; H05K 1/186; H05K 3/3436; H05K 2201/10325;
(Continued)

(56) References Cited

U.S. PATENT DOCUMENTS 3,672,986 A    6/1972    Schneble
4,188,438 A    2/1980    Burns
(Continued)

FOREIGN PATENT DOCUMENTS

JP     2003/217774     7/2003
WO     WO 91/14015     9/1991
(Continued)

OTHER PUBLICATIONS

Notification of Transmittal of the International Search Report and the Written Opinion of the International Searching Authority dated Jul. 30, 2010 in International Application No. PCT/US2010/036043.
(Continued)

*Primary Examiner* — Jean F Duverne

(57) ABSTRACT

An electrical interconnect and a method of making the same. A plurality of contact members are located in through holes in a substrate so distal portions of the contact members extend above a first surface of the substrate in a cantilevered configuration and proximal portions of the contact members are accessible along a second surface of the substrate. A flowable polymeric material located on the second surface of the substrate is fusion bonded to the proximal portions of the contact members so the flowable polymeric material substantially seals the through holes in the substrate. An insulator housing is bonded to the first surface of the substrate with the distal portions of the contact members located in through holes in an insulator housing, so the distal portions are accessible from a second surface of the insulator housing.

19 Claims, 10 Drawing Sheets

(51) Int. Cl.
*H01R 43/20* (2006.01)
*H01R 13/405* (2006.01)
*H05K 3/34* (2006.01)

(52) U.S. Cl.
CPC ......... *H01R 43/205* (2013.01); *H05K 3/3436* (2013.01); *H05K 2201/10325* (2013.01)

(58) Field of Classification Search
CPC ............ H01R 12/7076; H01R 12/7082; H01R 43/205; H01R 13/405; H01R 13/2442; H01R 12/714
See application file for complete search history.

(56) References Cited

U.S. PATENT DOCUMENTS

| | | | |
|---|---|---|---|
| 4,295,700 A | 10/1981 | Sado | |
| 4,489,999 A | 12/1984 | Miniet | |
| 4,922,376 A | 5/1990 | Pommer et al. | |
| 4,959,515 A * | 9/1990 | Zavracky | G06K 19/067 200/181 |
| 4,964,948 A | 10/1990 | Reed | |
| 5,014,159 A | 5/1991 | Butt | |
| 5,071,363 A | 12/1991 | Reylek et al. | |
| 5,072,520 A | 12/1991 | Nelson | |
| 5,090,116 A * | 2/1992 | Henschen | B23K 3/0475 29/827 |
| 5,096,426 A | 3/1992 | Simpson et al. | |
| 5,127,837 A | 7/1992 | Shah et al. | |
| 5,129,573 A | 7/1992 | Duffey | |
| 5,161,983 A | 11/1992 | Ohno | |
| 5,167,512 A | 12/1992 | Walkup | |
| 5,208,068 A | 5/1993 | Davis et al. | |
| 5,237,203 A | 8/1993 | Massaron | |
| 5,246,880 A | 9/1993 | Reele et al. | |
| 5,286,680 A | 2/1994 | Cain | |
| 5,334,029 A | 8/1994 | Akkapeddi et al. | |
| 5,358,621 A | 10/1994 | Oyama | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,619,018 A | 4/1997 | Rossi | |
| 5,659,181 A | 8/1997 | Bridenbaugh | |
| 5,674,595 A | 10/1997 | Busacco et al. | |
| 5,691,041 A | 11/1997 | Frankeny et al. | |
| 5,716,663 A | 2/1998 | Capote et al. | |
| 5,741,624 A | 4/1998 | Jeng et al. | |
| 5,746,608 A | 5/1998 | Taylor | |
| 5,761,801 A | 6/1998 | Gebhardt et al. | |
| 5,764,485 A | 6/1998 | Lebaschi | |
| 5,772,451 A | 6/1998 | Dozler et al. | |
| 5,785,538 A | 7/1998 | Beaman et al. | |
| 5,787,976 A | 8/1998 | Hamburgen et al. | |
| 5,802,699 A | 9/1998 | Fjelstad et al. | |
| 5,802,711 A | 9/1998 | Card et al. | |
| 5,819,579 A | 10/1998 | Roberts | |
| 5,880,590 A | 3/1999 | Desai et al. | |
| 5,904,546 A | 5/1999 | Wood et al. | |
| 5,913,109 A | 6/1999 | Distefano et al. | |
| 5,921,786 A | 7/1999 | Slocum et al. | |
| 5,925,931 A | 7/1999 | Yamamoto | |
| 5,933,558 A | 8/1999 | Sauvageau et al. | |
| 5,973,394 A | 10/1999 | Slocum et al. | |
| 6,020,597 A | 2/2000 | Kwak | |
| 6,062,879 A | 5/2000 | Beaman et al. | |
| 6,080,932 A | 6/2000 | Smith et al. | |
| 6,107,109 A | 8/2000 | Akram et al. | |
| 6,114,240 A | 9/2000 | Akram et al. | |
| 6,118,426 A | 9/2000 | Albert | |
| 6,120,588 A | 9/2000 | Jacobson | |
| 6,137,687 A | 10/2000 | Shirai et al. | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,225,692 B1 | 5/2001 | Hinds | |
| 6,247,938 B1 | 6/2001 | Rathburn | |
| 6,252,564 B1 | 6/2001 | Albert | |
| 6,255,126 B1 * | 7/2001 | Mathieu | G01R 1/06727 438/14 |
| 6,263,566 B1 | 7/2001 | Hembree et al. | |
| 6,270,363 B1 | 8/2001 | Brofman et al. | |
| 6,288,451 B1 | 9/2001 | Tsao | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,428,328 B2 | 8/2002 | Haba et al. | |
| 6,433,427 B1 | 8/2002 | Wu et al. | |
| 6,437,452 B2 | 8/2002 | Lin | |
| 6,437,591 B1 | 8/2002 | Farnworth et al. | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,462,568 B1 | 10/2002 | Cram | |
| 6,477,286 B1 | 11/2002 | Ouchi | |
| 6,490,786 B2 | 12/2002 | Belke et al. | |
| 6,494,725 B2 | 12/2002 | Lin et al. | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,572,396 B1 | 6/2003 | Rathburn | |
| 6,574,114 B1 | 6/2003 | Brindle et al. | |
| 6,593,535 B2 | 7/2003 | Gailus | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,662,442 B1 | 12/2003 | Matsui et al. | |
| 6,709,967 B2 | 3/2004 | Evers | |
| 6,744,126 B1 | 6/2004 | Chiang | |
| 6,750,473 B2 | 6/2004 | Amundson | |
| 6,758,691 B1 | 7/2004 | McHugh | |
| 6,765,288 B2 | 7/2004 | Damberg | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,821,131 B2 | 11/2004 | Suzuki et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,853,087 B2 | 2/2005 | Neuhasu et al. | |
| 6,856,151 B2 | 2/2005 | Cram | |
| 6,861,345 B2 | 3/2005 | Ball et al. | |
| 6,910,897 B2 | 6/2005 | Driscoll et al. | |
| 6,946,325 B2 | 9/2005 | Yean et al. | |
| 6,962,829 B2 | 11/2005 | Glenn et al. | |
| 6,965,168 B2 | 11/2005 | Langhorn | |
| 6,967,640 B2 | 11/2005 | Albert | |
| 6,971,902 B2 | 12/2005 | Taylor | |
| 6,987,661 B1 | 1/2006 | Huemoeller et al. | |
| 6,992,376 B2 | 1/2006 | Jaeck | |
| 7,009,413 B1 | 3/2006 | Alghouli | |
| 7,025,600 B2 | 4/2006 | Higashi | |
| 7,029,289 B2 | 4/2006 | Li | |
| 7,040,902 B2 | 5/2006 | Li | |
| 7,045,015 B2 | 5/2006 | Renn | |
| 7,064,412 B2 | 6/2006 | Geissinger et al. | |
| 7,070,419 B2 | 7/2006 | Brown et al. | |
| 7,095,090 B2 | 8/2006 | Nakajiman et al. | |

(56) References Cited

U.S. PATENT DOCUMENTS

| | | |
|---|---|---|
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,535,114 B2 | 5/2009 | Agraharam et al. |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,658,617 B1 * | 2/2010 | Brodsky ............... H05K 7/1069 439/66 |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,955,088 B2 | 6/2011 | Di Stefano |
| 7,999,369 B2 | 8/2011 | Malhan et al. |
| 8,044,502 B2 | 10/2011 | Rathburn |
| 8,058,558 B2 | 11/2011 | Mok et al. |
| 8,072,058 B2 | 12/2011 | Kim et al. |
| 8,114,687 B2 | 2/2012 | Mizoguchi |
| 8,120,173 B2 | 2/2012 | Forman et al. |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakaguchi |
| 8,536,889 B2 | 9/2013 | Nelson et al. |
| 8,610,265 B2 | 12/2013 | Rathburn |
| 8,618,649 B2 | 12/2013 | Rathburn |
| 8,704,377 B2 | 4/2014 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathburn |
| 8,987,886 B2 | 3/2015 | Rathburn |
| 8,988,093 B2 | 3/2015 | Rathburn |
| 9,054,097 B2 | 6/2015 | Rathburn |
| 9,076,884 B2 | 7/2015 | Rathburn |
| 9,093,767 B2 | 7/2015 | Rathburn |
| 9,136,196 B2 | 9/2015 | Rathburn |
| 9,184,145 B2 | 11/2015 | Rathburn |
| 9,184,527 B2 | 11/2015 | Rathburn |
| 9,196,980 B2 | 11/2015 | Rathburn |
| 9,231,328 B2 | 1/2016 | Rathburn |
| 9,232,654 B2 | 1/2016 | Rathburn |
| 9,276,336 B2 | 3/2016 | Rathburn |
| 9,276,339 B2 | 3/2016 | Rathburn |
| 9,277,654 B2 | 3/2016 | Rathburn |
| 9,318,862 B2 | 4/2016 | Rathburn |
| 9,320,133 B2 | 4/2016 | Rathburn |
| 9,320,144 B2 | 4/2016 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akram et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0141884 A1 | 7/2003 | Maruyama et al. |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |

(56) References Cited

U.S. PATENT DOCUMENTS

| | | |
|---|---|---|
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2006/0265919 A1 | 11/2006 | Huang |
| 2006/0281303 A1 | 12/2006 | Trezza et al. |
| 2007/0021002 A1 | 1/2007 | Laurx et al. |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0269999 A1 | 11/2007 | Di Stefano |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0117606 A1 | 5/2008 | Karlsson |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0047808 A1 | 2/2009 | Ma |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0321915 A1 | 12/2009 | Hu et al. |
| 2010/0133680 A1 | 6/2010 | Kang et al. |
| 2010/0143194 A1 | 6/2010 | Lee et al. |
| 2010/0213960 A1 | 8/2010 | Mok et al. |
| 2010/0290501 A1* | 11/2010 | De Bruyker ......... G01K 17/006 374/31 |
| 2010/0300734 A1 | 12/2010 | Ables et al. |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0002285 A1* | 1/2013 | Nelson ............... G01R 1/06738 324/755.09 |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0283922 A1* | 10/2013 | Qualtieri ............. G01Q 10/045 73/774 |
| 2013/0330942 A1 | 12/2013 | Rathburn |
| 2014/0043782 A1 | 2/2014 | Rathburn |
| 2014/0045350 A1 | 2/2014 | Taylor |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2014/0273641 A1* | 9/2014 | Light .................... H01R 43/16 439/625 |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181710 A1 | 6/2015 | Rathburn |
| 2015/0279768 A1 | 10/2015 | Rathburn |
| 2016/0014908 A1 | 1/2016 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |

(56) References Cited

FOREIGN PATENT DOCUMENTS

| | | |
|---|---|---|
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO 2015/006393 | 1/2015 |

OTHER PUBLICATIONS

Notification of Transmittal of the International Search Report and the Written Opinion of the International Searching Authority dated Jul. 21, 2010 in International Application No. PCT/US2010/036047.
Notification of Transmittal of the International Search Report and the Written Opinion of the International Searching Authority dated Jul. 28, 2010 in International Application No. PCT/US2010/036363.
Notification of Transmittal of the International Search Report and the Written Opinion of the International Searching Authority dated Jul. 28, 2010 in International Application No. PCT/US2010/036377.
Notification of Transmittal of the International Search Report and the Written Opinion of the International Searching Authority dated Jul. 30, 2010 in International Application No. PCT/US2010/036388.
Notification of Transmittal of the International Search Report and the Written Opinion of the international Searching Authority dated Jul. 27, 2010 in International Application No. PCT/US2010/036397.
Notification of Transmittal of the International Search Report and the Written Opinion of the International Searching Authority dated Jul. 30, 2010 in International Application No. PCT/US2010/036055.
Notification of Transmittal of the International Search Report and the Written Opinion of the International Searching Authority dated Aug. 4, 2010 in International Application No. PCT/US2010/036288.
Notification of Transmittal of the International Search Report and the Written Opinion of the International Searching Authority dated Aug. 4, 2010 in International Application No. PCT/US2010/036285.
Notification of Transmittal of the International Search Report and the Written Opinion of the International Searching Authority dated Jul. 30, 2010 in International Application No. PCT/US2010/036282.
Notification of Transmittal of the International Search Report and the Written Opinion of the International Searching Authority dated Jul. 30, 2010 in International Application No. PCT/US2010/036295.
Notification of Transmittal of the International Search Report and the Written Opinion of the International Searching Authority dated Jul. 30, 2010 in International Application No. PCT/US2010/036313.
Notification of Transmittal of the International Search Report and the Written Opinion of the International Searching Authority dated Aug. 3, 2010 in International Application No. PCT/US2010/037619.
Notification of Transmittal of the International Search Report arid the Written Opinion of the International Searching Authority dated Sep. 7, 2010 in International Application No. PCT/US2010/038600.
Notification of Transmittal of the International Search Report and the Written Opinion of the International Searching Authority dated Aug. 18, 2010 in International Application No. PCT/US2010/038606.
Notification of Transmittal of the International Search Report and the Written Opinion of the International Searching Authority dated Sep. 1, 2010 in International Application No. PCT/US2010/040188.
Notification of Transmittal of the International Search Report and the Written Opinion of the International Searching Authority mailed Aug. 20, 2010 in International Application No. PCT/US2010/040197.
Notification of Transmittal of the International Search Report and the Written Opinion of the International Searching Authority dated Apr. 14, 2011 in International Application No. PCT/US2011/023138.
Notification of Transmittal of the International Search Report and the Written Opinion of the International Searching Authority dated Aug. 17, 2011 in International Application No. PCT/US2011/033726.
Notification of Transmittal of the International Search Report and the Written Opinion of the International Searching Authority dated Sep. 27, 2011 in International Application No. PCT/US2011/038845.
Notification of Transmittal of the International Search Report and the Written Opinion of the International Searching Authority dated Feb. 8, 2012 in International Application No. PCT/US2011/056664.
Notification of Transmittal of the International Search Report and the Written Opinion of the International Searching Authority dated Mar. 26, 2012 in International Application No. PCT/US2011/062313.
Notification of Transmittal of the International Search Report and the Written Opinion of the International Searching Authority dated Jun. 20, 2012 in International Application No. PCT/US2012/027813.
Notification of Transmittal of the International Search Report and the Written Opinion of the International Searching Authority dated Jun. 19, 2012 in International Application No. PCT/US2012/027823.
Notification of Transmittal of the International Search Report and the Written Opinion of the International Searching Authority dated Nov. 29, 2012 in International Application No. PCT/US2012/053848.
Notification of Transmittal of the International Search Report and the Written Opinion of the International Searching Authority dated Jun. 3, 2013 in international Application No. PCT/US2013/031395.
Notification of Transmittal of the International Search Report and the Written Opinion of the International Searching Authority dated Jun. 19, 2013 in International Application No. PCT/US2013/030981.
Notification of Transmittal of the International Search Report and the Written Opinion of the International Searching Authority dated Jun. 7, 2013 in International Application No. PCT/US2013/030856.
Notification of Transmittal of the International Search Report and the Written Opinion of the International Searching Authority dated Oct. 27, 2014 in International Application No. PCT/US2014/045856.
Tarzwell, Robert, "A Real Printed Electronic Replacement for PCB Fabrication," PCB007 Magazine, May 19, 2009.

(56) References Cited

OTHER PUBLICATIONS

Tarzwell, Robert. "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert. "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Print—Definition of Print by the Free Dictionary, http://www.thefreedictionary.com/print, Aug. 13, 2014.
U.S. Appl. No. 15/062,136, filed Mar. 6, 2016, Mechanical Contact Retention Within an Electrical Connector.
U.S. Appl. No. 15/062,137, filed Mar. 6, 2016, Electrodeposited Contact Terminal For Use as an Electrical Connector or Semiconductor Packaging Substrate.
U.S. Appl. No. 15/070,026, filed Mar. 15, 2016, Fusion Bonded Formable Liquid Crystal Polymer Electrical Circuit Structure.

* cited by examiner

LOW PROFILE ELECTRICAL INTERCONNECT WITH FUSION BONDED CONTACT RETENTION AND SOLDER WICK REDUCTION

CROSS-REFERENCE TO RELATED APPLICATIONS

This application claims the benefit of U.S. Provisional Application No. 62/134,810, filed Mar. 18, 2015 and U.S. Provisional Application No. 62/146,550, filed Apr. 13, 2015, the disclosure of which are hereby incorporated by reference.

TECHNICAL FIELD

The present disclosure relates to a low-profile electrical interconnector with contact members fusion bonded to a substrate that forms a seal around the contact member to reduce solder wicking. The substrate is bonded to an insulator housing so distal portions of the contact members are located in through holes.

BACKGROUND OF THE INVENTION

Traditional IC sockets are generally constructed of an injection molded plastic, insulator housing that includes stamped and formed copper alloy contact members stitched or inserted into recesses. The assembled IC socket is then generally processed through a reflow oven to attach solder balls to the contact members.

During final assembly the contact pads on the printed circuit board ("PCB") are printed with solder paste or flux and the solder balls on the IC socket are placed in registration with the contact pads. The assembly is then reflowed and the solder balls essentially weld the IC socket to the PCB.

During use, an IC socket receives an IC device, such as a packaged integrated circuit. The contact members electrically couple the terminals on the IC device with the corresponding terminal on the PCB. The terminals on the IC device are typically held against the contact members by applying a load, which is expected to maintain intimate contact and reliable circuit connection throughout the life of the system without a permanent connection. As a result, the IC device can be removed or replaced without the need for reflowing solder connections.

These types of IC sockets and interconnects have been, produced in high volume for many years. As IC devices advance to next generation architectures traditional. IC sockets, have reached mechanical and electrical limitations that require alternate methods.

As processors and systems have evolved, several factors have impacted the design of traditional IC sockets. Increased terminal counts, reductions in the distance between the contacts known as terminal pitch, and signal integrity have been main drivers that impact the socket and contact design. As terminal counts go up, the IC package essentially gets larger due to the additional space needed for the terminals. As the package grows larger, costs go up and the relative flatness of the package and corresponding PCB require compliance between the contact and the terminal pad to accommodate the topography differences and maintain reliable, connection.

Package producers tend to drive the terminal pitch smaller so they can reduce the size of the package as well as the flatness effects. As the terminal pitch reduces, the available area to place a contact is also reduced, which limits the space available to locate a spring or contact member which can deflect without touching a neighbor. In order to maximize the length of the spring so that it can deflect the proper amount without damage, the thickness of the insulating walls within the plastic housing is reduced which increases the difficulty of molding as well as the latent stress in the molded housing, resulting in warpage during the heat applied during solder reflow. For mechanical reasons, the contact designs desire to have a long contact that has the proper spring properties. Long contact members tend to reduce the electrical performance of the connection by creating a parasitic effect that impacts the signal as, it travels through the contact. Other effects such as contact resistance impact the self-heating effects as current passes through power delivering contacts, and the small space between contacts can cause distortion as a nearby contact influences the neighbor which is known as cross talk. Traditional socket methods are able to meet the mechanical compliance requirements of today's needs, but they have reached an electrical performance limit.

Traditional sockets are manufactured from bulk plastic material that is machined to, provide device location features as well as positions for the electrical contacts that can be stamped and formed, blanked, wire electro-discharge machining processed, or constructed from conductive elastomer, coil spring probes, or several variations. The predominant contact type used in sockets is the spring probe, which basically consists of two or more metal members that engage each other to create the electrical path biased by a coil spring that provides normal and return force.

Traditional electrical contacts are press fit into the insulator housing. A polymer in the insulator housing is displaced during insertion to create an interference fit which holds the electrical contact in position. In some cases a flowable elastomeric material is dispensed onto the surface of the insulator, which flows into the insulator housing near the electrical contacts. When cured the flowable material holds the electrical contact in position.

Next generation systems will operate above 5 GHz and beyond and the existing interconnects will not achieve acceptable performance levels without significant revision. A major issue with the use of spring probes in sockets is the electrical performance is degraded by the coil spring which is an inductor, as well as the potential capacitance of the metal members and the relatively high contact resistance due to the various sliding connection point.

BRIEF SUMMARY OF THE INVENTION

The present disclosure is directed to a method of making an electrical interconnector. A plurality of contact members are positioned in through holes in a substrate so distal portions of the contact members extend above a first surface of the substrate in a cantilevered configuration and proximal portions of the contact members are accessible along a second surface of the substrate. A flowable polymeric is located on the second surface of the substrate adjacent the through holes. The substrate and the contact members are subject to sufficient energy and/or pressure so the flowable polymeric layer flows into engagement with the proximal portions of the contact members and fuses the contact members to the substrate. Distal portions of the contact members are positioned in through holes in an insulator housing. The first surface of the substrate is bonded to a first surface of the insulator housing so the distal portions are accessible from a second surface of the insulator housing.

The flowable polymeric material is fused to the contact members and substantially seals the through holes in the substrate. In one embodiment, distal portions of the contact members are formed with a plurality of beams maintained in a cantilevered relationship with respect to the first surface of the substrate. The beams elastically deform or flex to mechanically and electrically engage with terminals on circuit members.

The flowable polymeric material can be a layer positioned on the second surface of the substrate. The flowable polymeric material is then processed to reveal the proximal portions of the contact members, such as by imaging, or laser drilling. Alternatively, the flowable polymeric material is molded or deposited on the second surface of the substrate adjacent the through holes. The flowable polymeric material can be a low melt liquid crystal polymer, an epoxy set resin, a thermoset material, or a thermoplastic material.

In one embodiment, the substrate is formed from a first polymeric material have a first glass transition temperature and the flowable polymeric material from a second polymeric material have a second glass transition temperature. The second glass transition temperature is lower than the first glass transition temperature. The substrate and the contact members are, subjected to sufficient energy and/or pressure so the second glass transition temperature of the flowable polymeric material is exceeded, but the first glass transition temperature is not exceeded, so that the flowable polymeric material enters a molten or rubber-like state and flows into engagement with proximal portions of the contact members.

In one embodiment, the method includes electrically coupling proximal portions of the contact members to contact pads on a first circuit member. Terminals on a second circuit member are positioned in the through holes along the second surface of the insulator housing, and mechanically and electrically coupled to the distal portions of the contact members.

In another embodiment, solder ball terminals on a BGA device are positioned in the through holes along the second surface of the insulator housing. The distal portions of the contact members are elastically deformed or flex to mechanically and electrically engage with the solder ball terminals on the BGA device.

The present disclosure is also directed to an electrical interconnector. A plurality of contact members are located in through holes in a substrate so distal portions of the contact members extend above a first surface of the substrate in a cantilevered configuration and proximal portions of the contact members are accessible along a second surface of the substrate. A flowable polymeric material located on the second surface of the substrate is fusion bonded to the proximal portions of the contact members so the flowable polymeric material substantially seals the through holes in the substrate. An insulator housing is bonded to the first surface of the substrate with the distal portions of the contact members located in through holes in an insulator housing, so the distal portions are accessible from a second surface of the insulator housing.

In one embodiment, the distal portions of the contact members include a plurality of beams maintained in a cantilevered relationship with respect to the first surface of the substrate. The beams elastically deform or flex to mechanically and electrically engage with terminals on a circuit member.

In one embodiment, the substrate is formed from a first polymeric material have a first glass transition temperature and the flowable polymeric material from a second polymeric material have a second glass transition temperature, wherein the second, glass transition temperature is lower than the first glass transition temperature.

The present disclosure is also directed to an electrical assembly including contact pads on a first circuit member electrically coupled proximal portions of the contact members. Terminals on a second circuit member are positioned in the through holes along the second surface of the insulator housing, and mechanically and electrically coupled with distal portions of the contact members.

In an alternate embodiment, the electrical assembly includes solder ball terminals on a BGA device positioned in the through holes along the second surface of the insulator housing. The distal portions of the contact members are mechanically and electrically coupled with the solder ball terminals on the BGA device.

The contact members can be stamped, formed, etched or fabricated from conventional means and assembled loose or retained on a strip until they are removed and installed. The contact members can be of virtually any size and shape. The insulator housing can be constructed with a variety of techniques, such as injection molding, laminated in layers using traditional circuit board fabrication techniques, printed by depositing polymers in desired locations, or a combination thereof.

DETAILED DESCRIPTION OF THE INVENTION

Figure 1A:
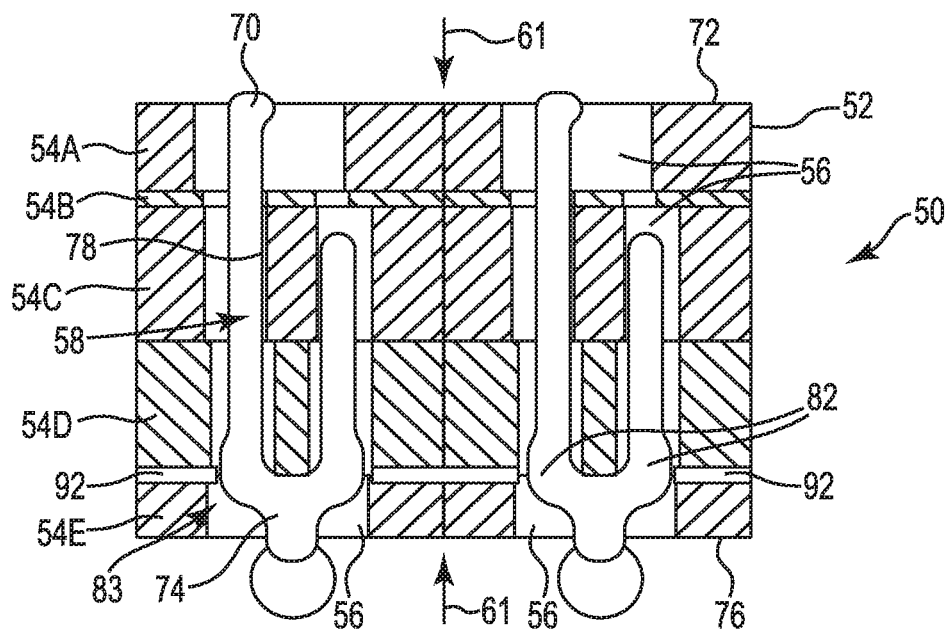
FIGS. 1A and 1B are cross sectional views of a multi-layered insulator housing for an electrical connector with a flowable contact retention region in accordance with an embodiment of the present disclosure.
Figure 1B:
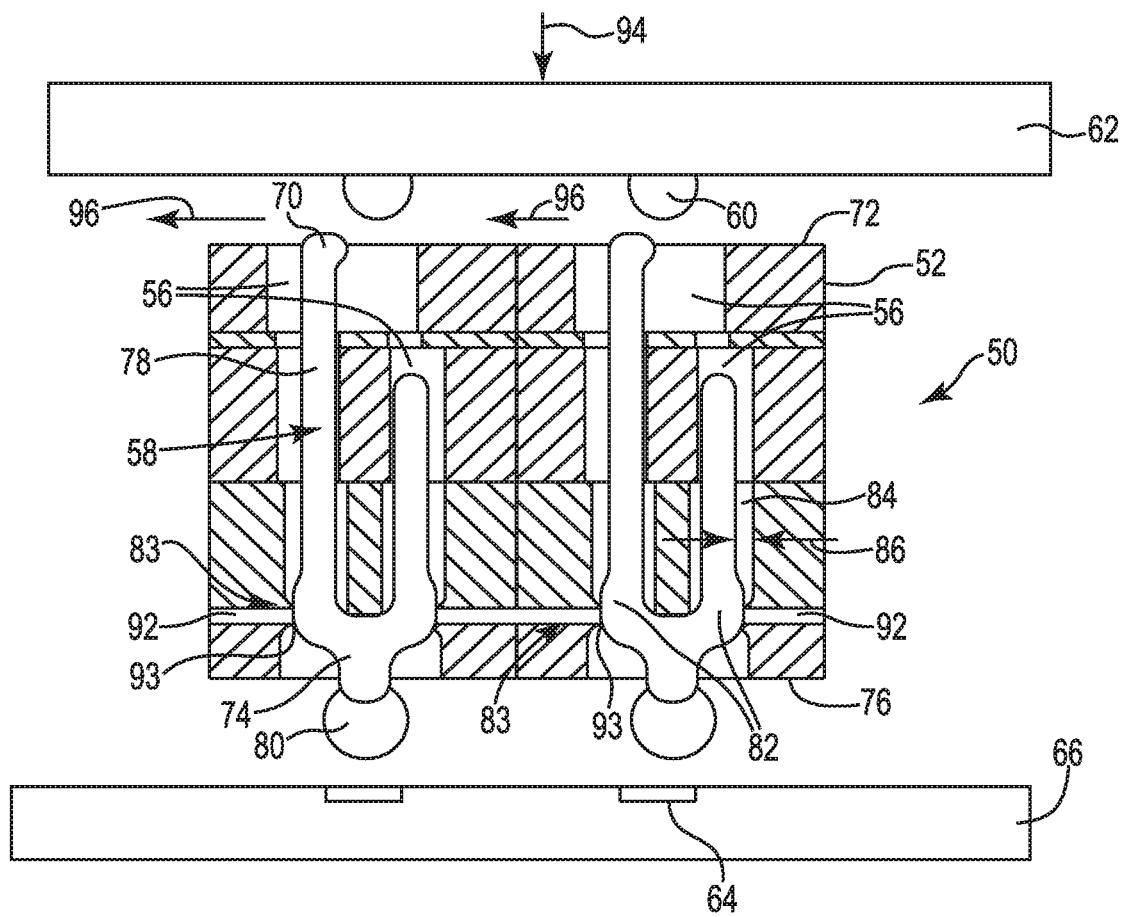

FIGS. 1A and 1B are sectional views of an electrical connector 50 in accordance with an embodiment of the present disclosure. Insulator housing 52 is constructed with a plurality of layers 54A, 54B, 54C, 54D, 54E ("54"). In one embodiment, the layers 54 are discrete layers bonded using a variety of techniques, such as adhesive bonding, ultrasonic or solvent welding, and other techniques known to those in the art. In another embodiment, some of the layers can be molded or machined as a subassembly.

A plurality of through holes 56 are formed in the insulator housing 52 to receive contact members 58. The through holes 56 and contact members 58 are arranged to correspond with terminals 60 on first circuit member 62 and contact pads 64 on second circuit device 66. In the embodiment illustrated in FIG. 1B the terminals 60 are solder balls and the first circuit member 62 is an integrated circuit device. The second circuit member 66 is a PCB.

The layers 54 of the insulator housing 52 can be constructed from a variety of materials, as polyimide or liquid crystal polymer. If the electrical connector 50 is a rigid structure, one or more of the layers 54 can be FR4 or one of many high speed laminates or substrates. If the electrical connector 50 is a semiconductor package, one of the layers 54 can be a material such as FR4, BT resin of any one of a variety of laminate or substrate materials.

The contact members 58 are preferably sized to loosely fit in the through holes 56. The loose-fit arrangement permits vibratory insertion or high speed stitching. The contact members 58 are preferably beam structures with first end portions 70 locating near first surface 72 of the insulator housing 52 and second end portions 74 located near a second surface 76 of the insulator housing 52.

In the illustrated embodiment, layer of a flowable polymeric material 92 is located between layers 54D and 54E in retention region 83. The layer of a flowable polymeric material 92 can be constructed from a thermoplastic material, an epoxy set resin, a low-melt liquid crystal polymer, a thermoset resin, and a variety of other polymeric materials. As best illustrated in FIG. 1B, the flowable material 92 is plastically deformed by applying energy and/or pressure to the electrical connector 50. The energy can be, for example, heat, ultrasonic stimulation, infrared RF, or some combination thereof. Pressure 61 is also preferably applied to facilitate the flow of the flowable polymeric material 92 into engagement with the contact members 58. By controlling the quantity and, duration of energy applied to the electrical connector 50 it is possible to form seal 93 around the contact member 58 in the engagement region 83, without compromising the structural integrity of the insulator housing 52. The seal 93 serves to both retain the contact member 58 in the insulator housing 52 and reduce solder 80 from wicking into the through holes 56.

In the illustrate embodiment, the flowable material 92 engages with retention features 82 on the contact members 58. The retention features 82 reduce the gap between the flowable material 92 and the contact members 58 created by the through holes 56.

Locating retention region 83 near the second surface 76 of the insulator housing 52 maintains the first end, portions 70 of the contact members 58 in a free-floating or cantilevered configuration. Main beams 78 of the contact members 58 are configured to flex within the through holes 56 when terminals 60 are compressively engaged with the first, end portions 70. Gap 86 is maintained between the layer 54D and the contact members 58 in the region 84. Solder balls 80 on second end portions 74 of the contact members 58 serve to electrically and mechanically couple the contact members 58 to the contact pads 64 on the second circuit member 66.

In one embodiment, the layers 54 are constructed from a first polymeric material have a first glass transition temperature and the layer of a flowable polymeric material 92 is preferably constructed from a second flowable polymeric material with a second glass transition temperature that is lower than the first glass transition temperature. After the contact members 58 are loosely positioning within the through holes 56, the electrical connector 50 is subjected to sufficient energy and/or pressure so the second glass transition temperature of the layer of a flowable polymeric material 92 is exceeded, but the first glass transition temperature of the first polymeric material is not exceeded. As best illustrated in FIG. 1B, when the layer of a flowable, polymeric material 92 is in the glass transition state it flows into engagement with retention features 82 on the contact members 58 in retention region 83 on the insulator housing 52.

The glass-liquid transition or glass transition short is the reversible transition in amorphous materials (or in amorphous regions within semi crystalline materials) from a hard and relatively brittle "glassy" state into a molten or rubber-like state, as the temperature is increased. The reverse transition, achieved by cooling the viscous liquid into the glass state, is referred to as vitrification. The glass-transition temperature ($T_g$) of a material characterizes the range of temperatures over which this glass transition occurs. The glass transition temperature is always lower than the melting temperature ($T_m$) of the crystalline state of the material, if one exists.

Once the electrical connector 50 is cooled so the layer of a flowable polymeric material 92 is below the second glass transition temperature, the layer of a flowable polymeric material 92 resumes the glass state (i.e., vitrification) and securely retain the contact members 58 in the through holes 56. In one embodiment, the layer of a flowable polymeric material 92 preferably substantially surrounds the contact member 58 to prevent wicking of the solder 80 into the insulator housing 52.

After heat-cycling and cooling the flowable polymeric material 92, the contact members 58 are fused to the retention region 83. As used herein, "fused" or "fusing" refers to bonding or joining a component to a polymeric material by subjecting the polymeric material to sufficient energy and/or pressure to cause the materials to bond together. In some embodiments, fusing requires the glass transition temperature of the polymeric material to be temporarily exceeded.

By locating retention region 83 near the second surface 76 of the insulator housing 52, first end portions 70 of the contact members 58 are maintained in a cantilevered relationship with respect to the first surface 72. Compressively engaging the first circuit member 62 against the electrical connector 50 in direction 94 causes the terminals 60 to flex elastically the first end portions 70 of the contact members 58, primarily along the main beams 78, in direction 96 to form a compressive electrical connection between the first end portions 70 and the terminals 60.

In one embodiment, the flowable polymeric material 92 is a low temperature LCP. LCP's are a class of aromatic polyester polymers that are extremely unreactive and inert so as to be useful for electrical applications. Liquid crystal polymers are a rod-like molecular structure, rigidness of the long axis, and strong dipoles and/or easily polarizable substituents. The distinguishing characteristic of the liquid crystalline state is the tendency of the molecules to point along a common axis. This is in contrast to molecules in the liquid phase, which have no intrinsic order. In the solid state, LCP molecules are highly ordered and, have little translational freedom.

Liquid-crystal polymers are available in melted/liquid or solid form. The melting temperatures ranges from about 280° C. to about 400° C. and glass transition temperatures range from about 145° C. to about 400° C., providing sufficient range to select appropriate materials for the first and second polymeric materials.

In solid form the main example of lyotropic LCPs is the commercial aramid known as Kevlar. In a similar way, several series of thermotropic LCPs have been commercially produced by several companies (e.g., Vectran/Ticona). LCP materials have a dielectric constant of about 2.9 at a frequency of about 20 GHz, a co-efficient of thermal expansion of about 8 to about 17 ppm/degree C., and a dimensional, stability of less than about 0.1%. Use of LCP material in circuit structures is disclosed in U.S. Pat. Publ. No. 2016/0014908 (Rathburn), which is hereby incorporated by reference.

Another advantage to the multilayer insulator housing 52 is that by modifying the dielectric properties of the layers 54 in a region around the contact members 58 at specific points relative to the contact geometries, changes in the capacitive field can be made to offset the inductance of the contact members 58. This "impedance tuning" can be done using a variety of techniques, including adding a continuous layer of a higher dielectric constant material, by varying the dielectric constants of the housing layers 54, or by adding localized metal at multiple points within a layer or region adjacent to the contact members 58. In the context of the present multi-layered socket housing, these changes may include increasing the thickness of the center layers 54C relative to the surface layers 54A, 54E, selecting a material for the center layer 54C with a higher dielectric constant, maintain an air gap between the center layer 54C and the contact members 58, and/or adding metal to portions of the socket housing to surround the contact members 58, each of which is discussed in U.S. patent application Ser. No. 14/565,724, entitled Performance Enhance Semiconductor Socket, filed Dec. 10, 2014, which is hereby incorporated by reference. The various structures for impedance tuning may be used alone or in combination with each other. The various structures for impedance tuning may be used alone or in combination with each other.

Figure 2A:
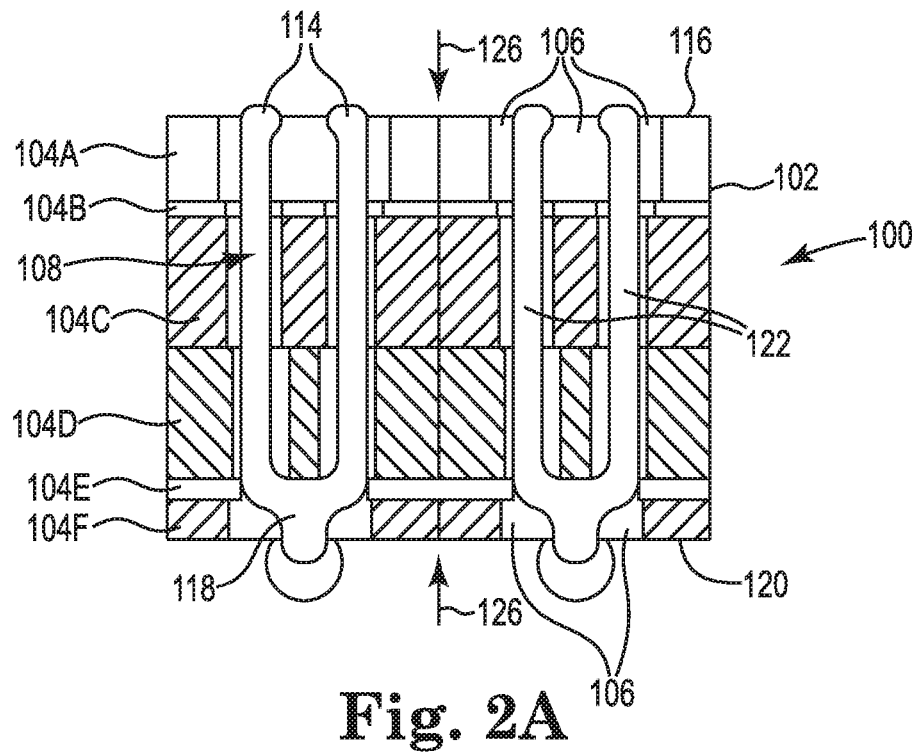
FIGS. 2A and 2B are cross sectional views of an alternate multi-layered insulator housing for an electrical connector with a flowable contact retention region in accordance with an embodiment of the present disclosure.
Figure 2B:
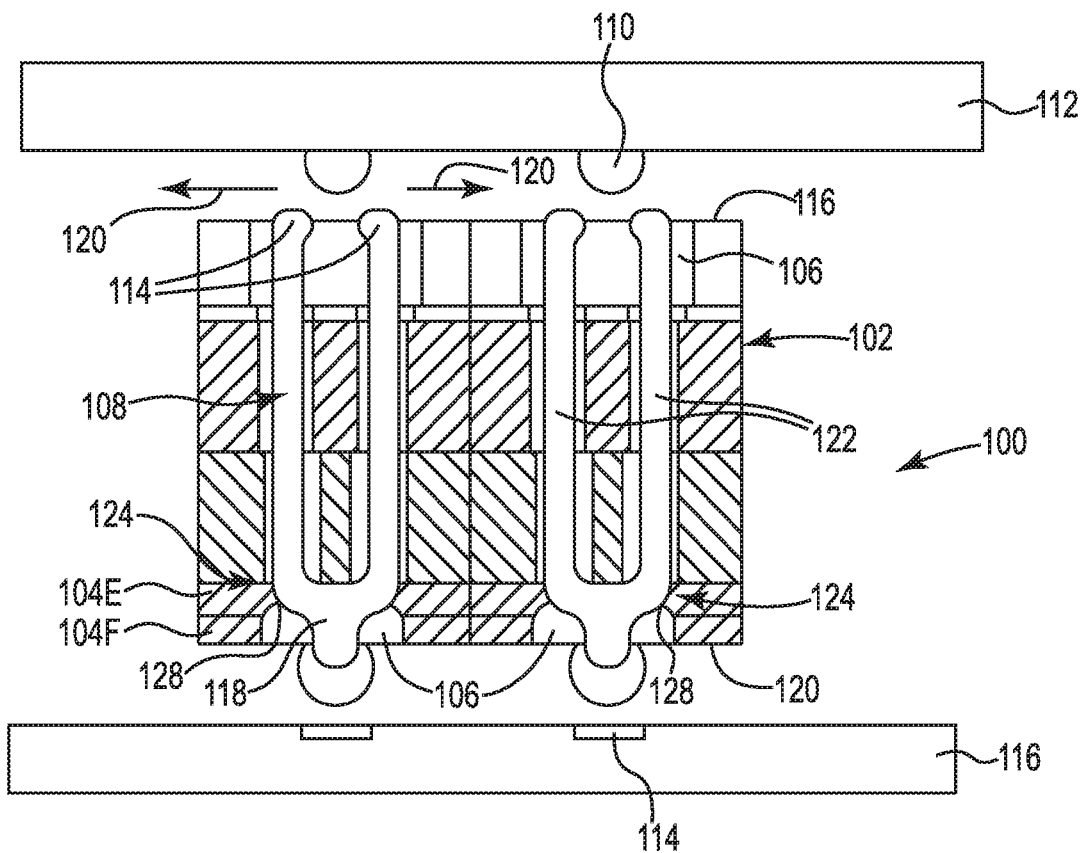

FIGS. 2A and 2B are sectional views of an alternate electrical connector 100 in accordance with an embodiment of the present disclosure. Insulator housing 102 is constructed with a plurality of layers 104A, 104B, 104C, 104D, 104E, 104F ("104"). A plurality of through holes 106 are formed in the insulator housing 102 to receive contact members 108. The through holes 106 and contact members 108 are arranged to correspond with terminals 110 on first circuit member 112 and contact pads 114 on second circuit device 116.

The contact members 108 are preferably sized to loosely fit in the through holes 106. The contact members 108 are preferably dual-beam structures with first end portions 114 located near first surface 116 of the insulator housing 102 and second end portions 118 located near a second surface 120 of the insulator housing 102. Main beams 122 of the contact members 108 are configured to flex outward in direction 120 within the through holes 106 when terminals 110 are compressively engaged with the first end portions 114.

In one embodiment, the layers 104A, 104B, 104C, 104D, and 104F are preferably constructed from a first polymeric material have a first glass transition temperature. The layer 104E is preferably constructed from a flowable polymeric material with a second glass transition temperature that is lower than the first glass transition temperature. After the contact members 108 are loosely positioning within the through holes 106, the electrical connector 100 is subjected to sufficient energy and/or pressure so the second glass transition temperature of the second flowable polymeric material is exceeded, but the first glass transition temperature of the first polymeric material is preferably not exceeded.

As best illustrated in FIG. 2B, the second flowable polymeric material (i.e., layer 104E) enters a molten or rubber-like state and flows into engagement with the second end portions 118 of the contact members 108 in retention region 124. In the preferred embodiment, the second flowable polymeric material seals the contact members 108 to the insulator housing 102 to reduce solder wicking.

In an alternate embodiment, pressure 126 is used to plastically deform the layer 104E to achieve the configuration illustrated in FIG. 2B. Once the layer of flowable polymeric, material 104E is in physical contact with the contact members 108 in the retention region 124, heat is applied to cure the layer 104E, thereby forming seal 128 with the contact members 108.

Figure 3:
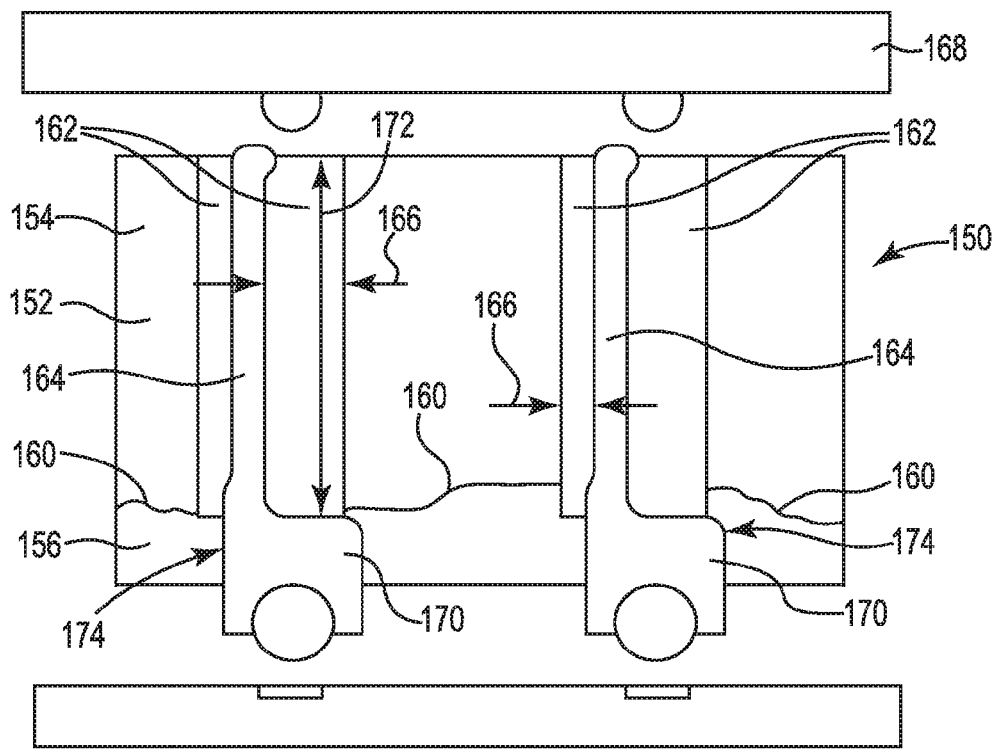
FIG. 3 is a cross sectional view of a molded insulator housing for an electrical connector with a flowable contact retention region in accordance with an embodiment of the present disclosure.

FIG. 3 is a sectional view of an alternate electrical connector 150 where the insulator housing 152 is molded to include first and second polymeric materials 154, 156 in accordance with an embodiment of the present disclosure. In one embodiment, the insulator housing 152 is co-injection molded by sequentially injecting the first and second polymeric materials 154, 156. The polymeric materials 154, 156 intersect at interface region 160, but preferably to not substantially mix.

A plurality of through holes 162 are formed in the insulator housing 152 to receive contact members 164. The contact members 164 include a retention feature 170 that engages primarily with the second flowable polymeric material 156 in the insulator housing 152 at retention region 174. The through holes 162 are sized to maintain gaps 166 in the region of the insulator housing 152 constructed from the first polymeric material 154 to permit flexure in flexure region 172 during engagement with circuit member 168. The gap 166 facilitates insertion of the contact members 164 before reflow and prevents engagement with the contact member 164 in the flexure region 172 during reflow of the second flowable polymeric material 156. As discussed herein, energy and/or pressure is applied to the electrical connector 150 so the second flowable polymeric material 156 flows and is fused to the contact member 164 in the retention region 174.

Figure 4:
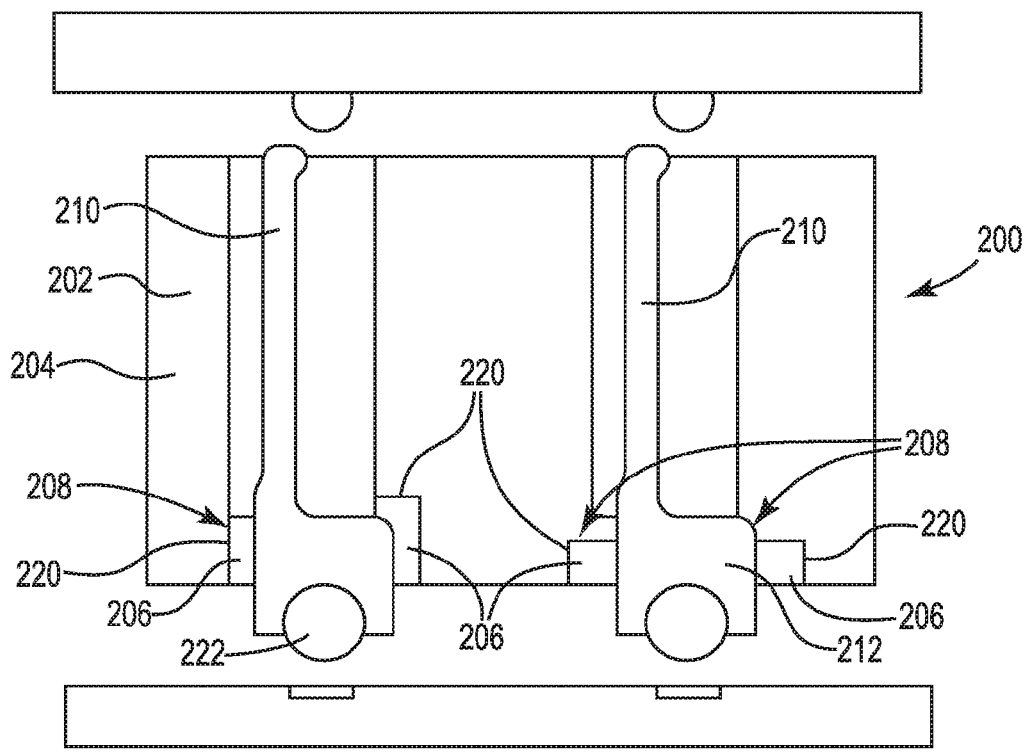
FIG. 4 is a cross sectional view of an insulator housing for an electrical connector with a printed flowable contact retention region in accordance with an embodiment of the present disclosure.

FIG. 4 is a sectional view of an alternate electrical connector 200 where the insulator housing 202 is molded from a first polymeric material 204 and the second flowable polymeric material 206 is selectively printed in retention region 208 in accordance with an embodiment of the present disclosure. In the illustrated embodiment, the first polymeric material 204 is molded with recesses 220 configured to receive the second flowable polymeric material 206. The second flowable polymeric material 206 is preferably printed on the insulator housing 202 before insertion of contact members 210.

Energy and/or pressure is applied to the electrical connector 200 so the second flowable polymeric material 206 flow and fuses with the contact member 210 in the retention region 208. In the illustrated embodiment, the second flowable polymeric material 206 engages with retention feature 212 on the contact members 210. In one embodiment, the second flowable polymeric material 206 substantially surrounds the perimeter of the contact member 210 in the retention region 208 to reduce wicking of solder 222 into the insulator housing 202.

Figure 5A:
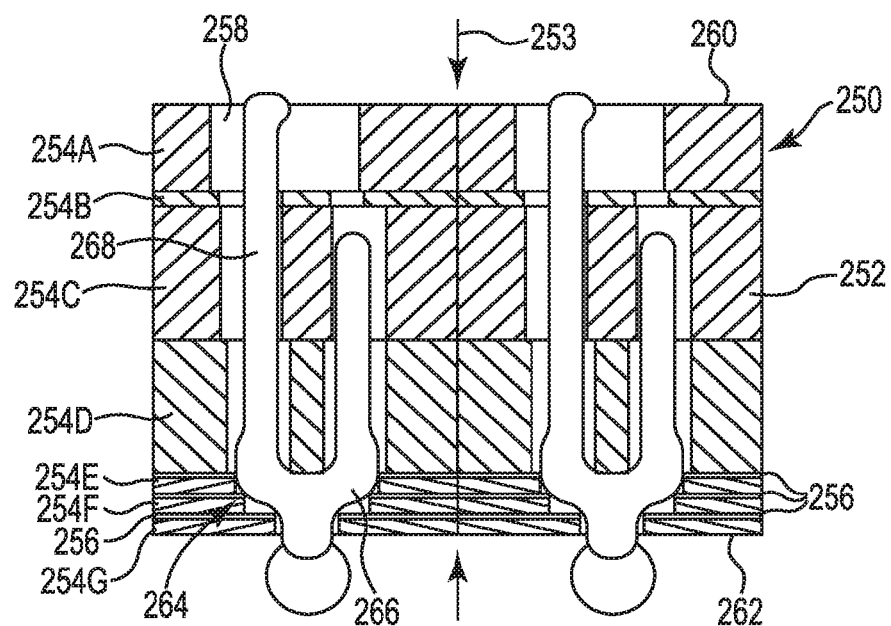
FIGS. 5A and 5B are cross sectional views of a multi-layered insulator housing for an electrical connector with a plurality of flowable contact retention regions in accordance with an embodiment of the present disclosure.
Figure 5B:
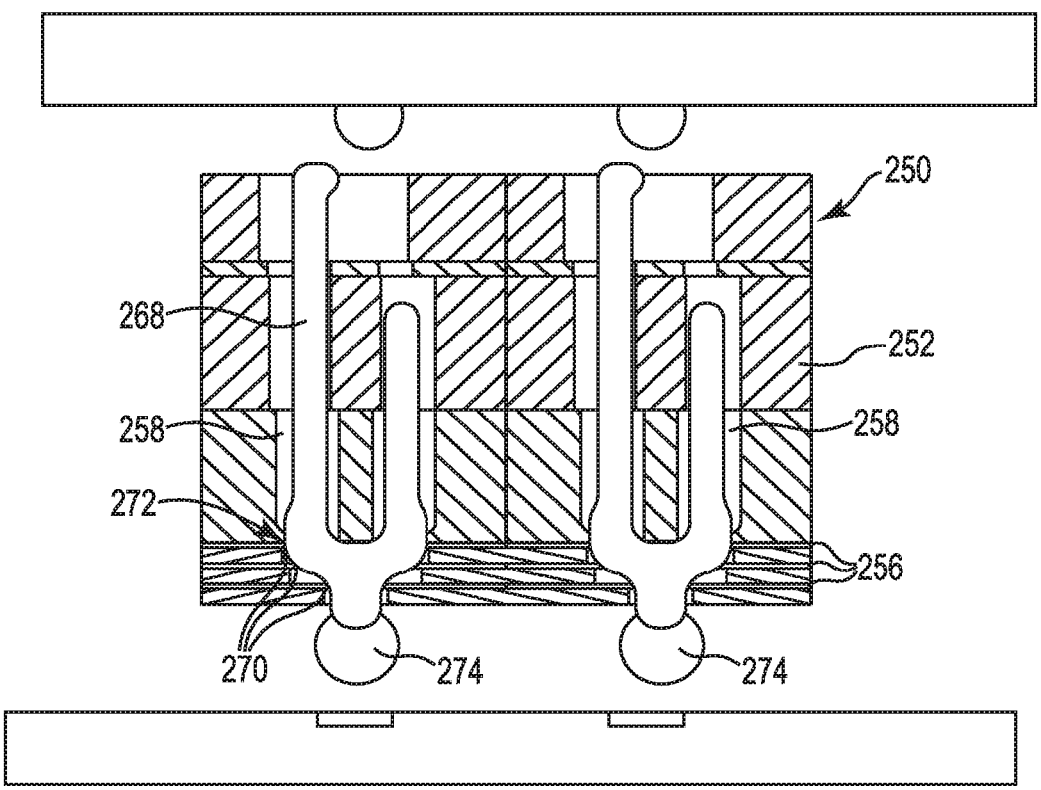

FIGS. 5A and 5B are sectional views of an electrical connector 250 in accordance with an embodiment of the present disclosure. Insulator housing 252 is constricted with a plurality of layers 254A, 254B, 254C, 254D, 254E, 250F, 250G ("254"). In the illustrated embodiment, layers of a flowable polymeric material 256 are located between the layers 254D, 254E, 254F, 254G. The layers 254, 256 are preferably bonded using a variety of techniques, such as adhesive bonding, ultrasonic or solvent welding, and other techniques known to those in the art. In another embodiment, some of the layers can be molded or machined as a subassembly after the fact.

Through holes 258 extend from first surface 260 to second surface 262. In the illustrate embodiment, through holes 258 in the layers 254E, 254F, 254O are sized to create contours 264 that generally corresponds with shape of retention features 266 of contact members 268. The complementary shapes of the contour 264 and the retention features 266 brings the flowable layers 256 in close proximity to bridge the gap there between.

The contact members 268 are preferably sized to loosely fit in the through holes 258. The contact members 268 have a shape and function generally as discussed in connection with FIGS. 1A and 1B.

As best illustrated in FIG. 5B, the flowable material 256 is plastically deformed by applying energy and/or pressure 253 to the electrical connector 250. By controlling the quantity and duration of energy and/or pressure 253 applied to the electrical connector 250 it is possible to form seal 270 around the contact member 268 in engagement region 272, without compromising the structural integrity of the insulator housing 252. The seal 270 serves to both retain the contact member 268 in the insulator housing 252 and inhibits solder 274 from wicking into the through holes 258.

Figure 6A:
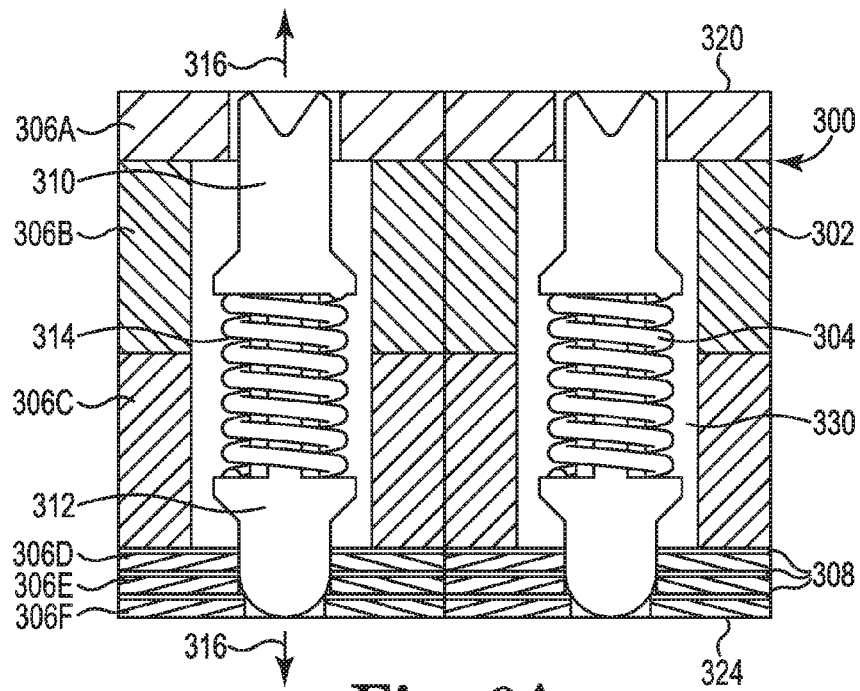
FIG. 6A-6B are cross sectional views of spring contact members in an electrical connector with a plurality of flowable contact retention regions in accordance with an embodiment of the present disclosure.
Figure 6B:
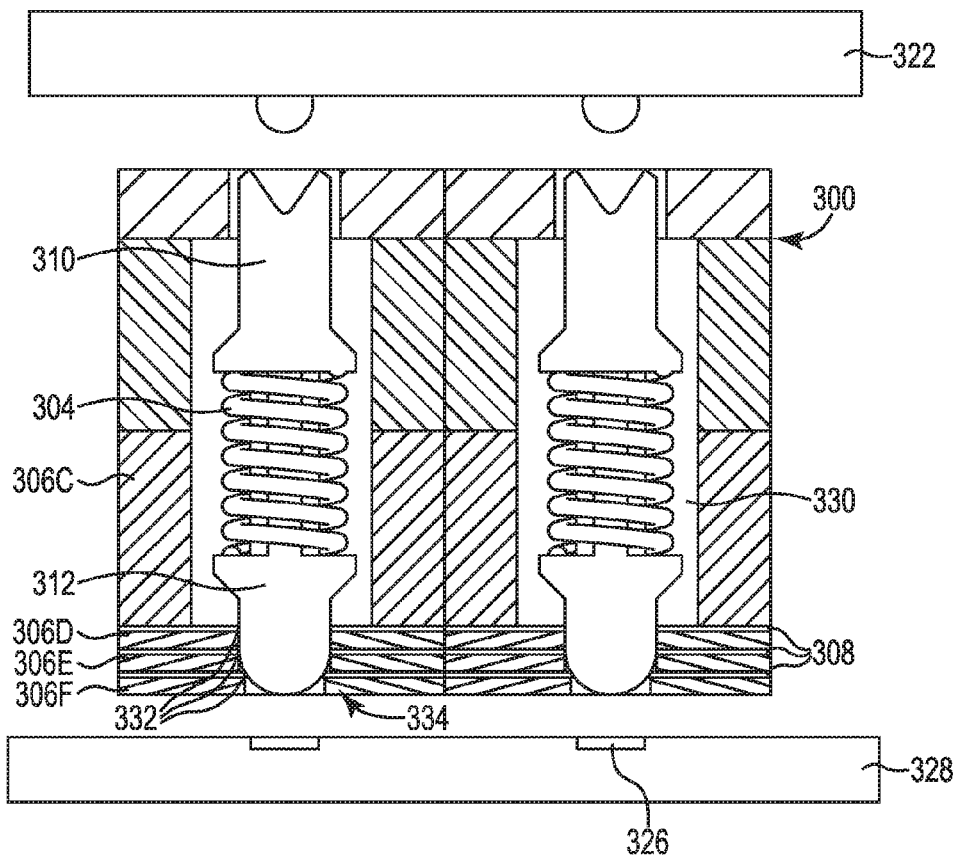

FIGS. 6A and 6B are sectional views of alternate electrical connector 300 with insulator housing 302 retaining, spring contact members 304. The insulator housing 302 is constructed from multiple layers 306A, 306B, 306C, 306D, 306E, 306F ("306") in accordance with an, embodiment of the present disclosure. In one embodiment, layers of a flowable polymeric material 308 are located between the layers 306C, 306D, 306E, 306F. Additional details about insulator housings with spring contact members applicable to this disclosure are disclosed in U.S. Pat. No. 8,758,067 (Rathburn) and U.S. Pat. Publ. 2015/0091600 (Rathburn), filed Dec. 10, 2014, the disclosures of which are hereby incorporated by reference in their entireties.

The spring contact members 304 are of a conventional structure with an upper portion 310 that slides axially relative to lower portion 312. Spring member 314 located in through holes 330 biases the upper portion 310 away from the lower portion 312 along axis 316. In application, upper portion 310 extends above top surface 320 of the insulator housing 302 to engage with contact members on the IC device 322. Simultaneously, lower portion 312 extends beyond lower surface 324 of the insulator housing 302 to engage with contact pads 326 on the PCB 328. The lower portion 312 is typically soldered to the contact pads 326.

The through holes 330 in the layers 306D, 306E, 306F are sized to follow contour of the lower portion 312. Applying energy and/or pressure to the electrical contact 300 causes plastic deformation of the layers of a flowable polymeric material 308, which forms a seal 332 around the lower portion 312 at retention region 334 to prevent solder wicking.

Figure 7A:
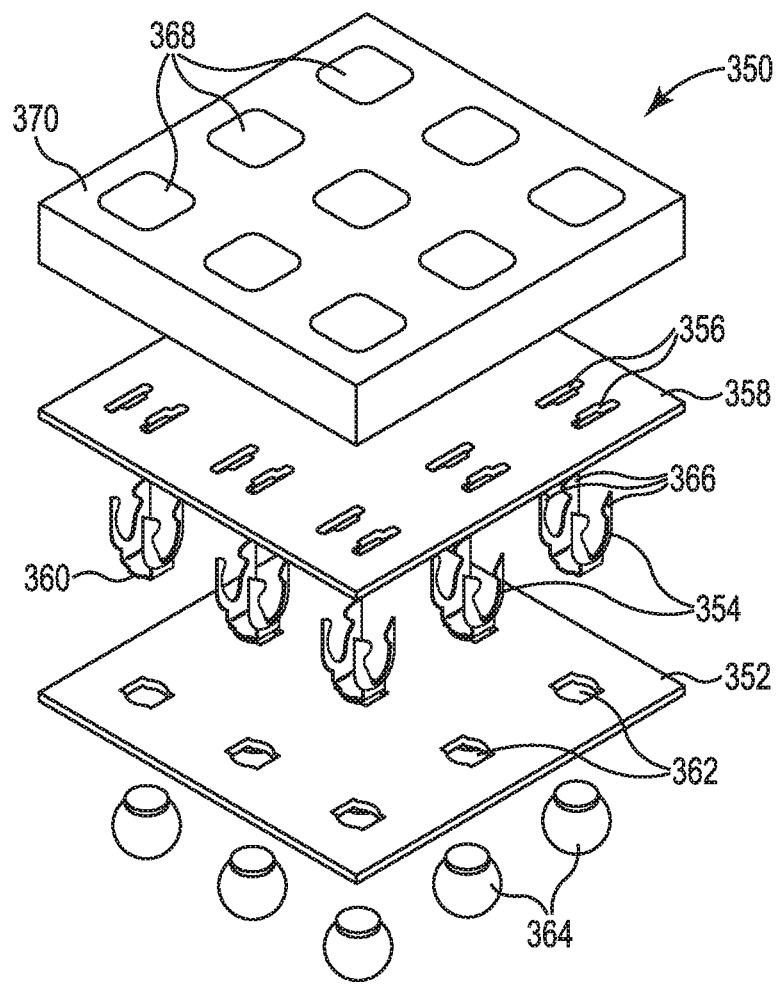
FIGS. 7A and 7B are exploded views of a socket with a flowable contact retention region in accordance with an embodiment of the present disclosure.
Figure 7B:
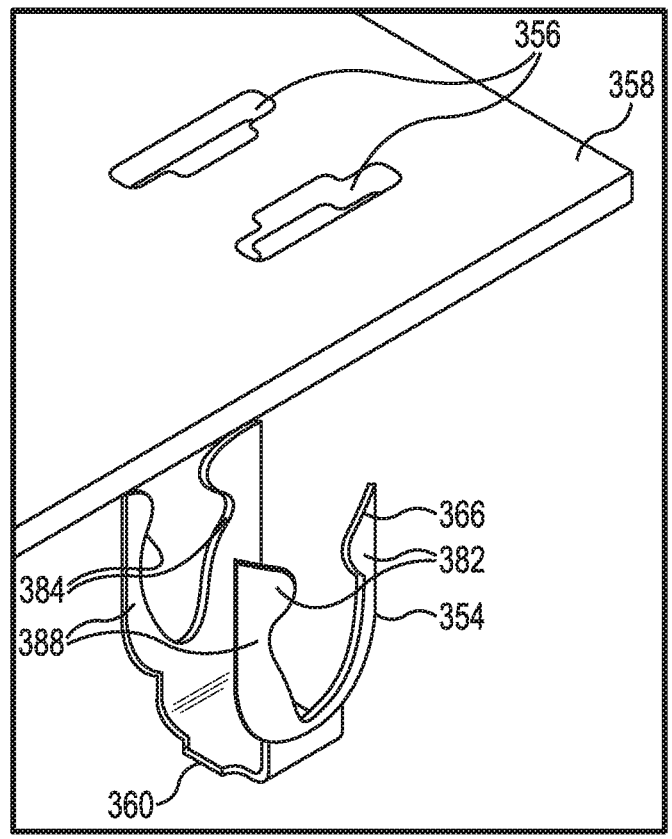
Figure 7C:
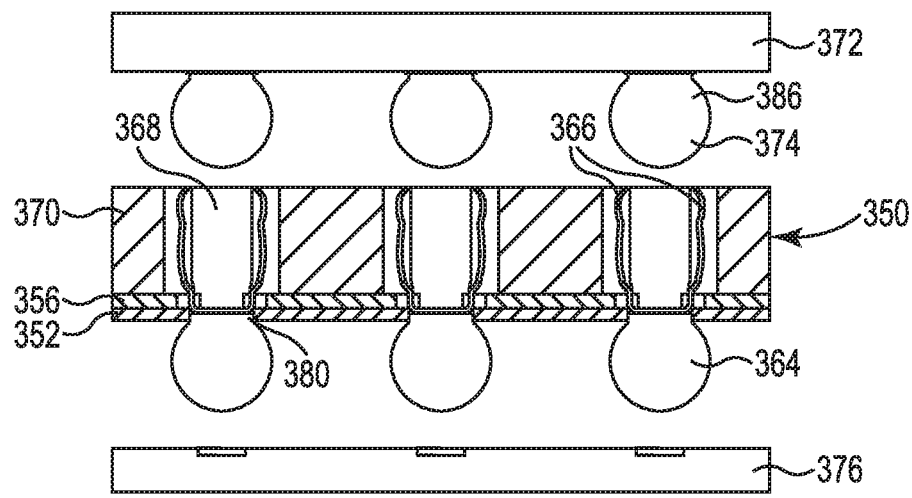
FIG. 7C is a side sectional view of the socket of FIG. 7A.

FIGS. 7A through 7C illustrate a surface mount technology BGA socket 350 with a layer of a flowable polymeric material 352 in accordance with an embodiment of the present disclosure. Contact members 354 are inserted in preformed openings 356 in substrate 358. After insertion, the layer of flowable polymeric material 352 is positioned over proximal ends 360 of the contact members 354. Energy and/or pressure is applied to flow the layer of flowable polymeric material 352 into engagement with the contact members 354. The contact members 354 are now mechanically retained to the substrate 358. The flowable polymeric material 352 also forms a seal around the contact members 354 in the openings 356, so that when solder balls 364 are attached and subsequent reflowed to circuit board 376 the solder 364 is prevented from wicking up the contact members 354 and into the insulator housing 370. In an alternate embodiment, the flowable polymeric material 352 is molded or deposited on the substrate 358 adjacent the openings 356.

The substrate 358 containing the contact members 354 can be inverted to expose proximal ends 360 of the contact members 354, which will typically connect to the printed circuit board during final assembly. The rear surface of the substrate 358 and the exposed proximal ends 360 of the contact members 354 can be treated as a field of connection points for further enhancement that provides contact retention, adds circuit features not normally embedded within a socket, adds mechanical features to improve the reliability of the solder joint to the PCB, and provides a platform to add passive and active circuit features to improve electrical performance or internal function and intelligence, such as disclosed in commonly assigned U.S. Pat. No. 8,955,215 (Rathburn), which is hereby incorporated by reference.

In the illustrated embodiment, the flowable polymeric material 352 preferably includes an array of openings 362 that correspond with the proximal ends 360 of the contact members 354 so that solder balls 364 can be applied. In an alternate embodiment, the flowable polymeric material 352 is applied as a continuous sheet without the openings 362 and the openings 362 are subsequently drilled, such as with a laser. Distal ends 366 of the contact members 354 are then positioned in openings 368 in insulator housing 370.

For some applications Cu may be too soft to be used as the contact members 354, so CuNiSi or other copper alloy may be substituted. In the illustrate embodiment, the contact members 354 do not include contact retention features, greatly reducing the complexity of the component and the tooling required to produce them. After insertion, the flowable polymeric material 352 retains the contact members 354 in the socket 350.

As best illustrated in FIG. 7C, the socket 350 enables direct socketing of BGA device 372 without reflow to the solder balls 374. The socket 350 permits the BGA device 372 to be removable and replaceable without the need for rework or reflow of the solder balls 374. The socket 350 itself is soldered to PCB 376. The distal portions 366 of the contact members 354 are shaped to accept the solder balls 374 on the BGA device 372 in a manner that retains the BGA device 372, but allows the BGA device 372 to be lifted out.

The challenge with this type of product is to create an interface between the solder ball 374 on the BGA device 372 and the contact tips 366 such that the BGA device 372 can be inserted with low enough force to enable insertion by hand, while still providing stable contact resistance and reliable connection. Related to this challenge is the extraction force relative to insertion force such that the BGA device 372 can be easily removed by hand or with the aid of a tool without breaking solder joints 380 between the contact members 354 and the PCB 376 as well as the joint, from the BGA device 372 to the solder balls 374.

As best illustrated in FIG. 7B, distal portions 366 of the contact members 354 include contact tips 382 that score the solder balls 374 during insertion to remove oxides. Adjacent a curved region 384 has a diameter corresponding to a diameter of the solder balls 374 to capture the solder balls 374 in the insulator housing 370. Once the BGA device 372 is fully seated there will be a slight engagement of the contact tips 382 beyond the upper hemisphere 386 of the solder ball 374 diameter to retain the solder ball 374 in the insulator housing 370. Several varieties of contact shapes and geometries can be formed to optimize the interface and reliability, with multiple points of contact greatly enhancing probability of reliable connection as well as reducing inductance and contact resistance. (See FIGS. 7E-7G).

The intent of the design is to "loosely" or slightly cradle the solder balls 374 on the BGA device 372 in the openings 368 in the insulator housing 370. The openings 368 in the insulator housing 370 are sized to permit the beams 388 to flex slightly while the openings 368 in the insulator housing 370 prevent over deflection of the beams 388. The beams 388 can also be shorter to minimize the height of the socket 350. The contact members 354 can also be coined or formed with a single beam 388 that closely surrounds the solder balls 374 to provide multiple points of contact as well as reduce metal content to improve capacitive effects.

Figure 7D:
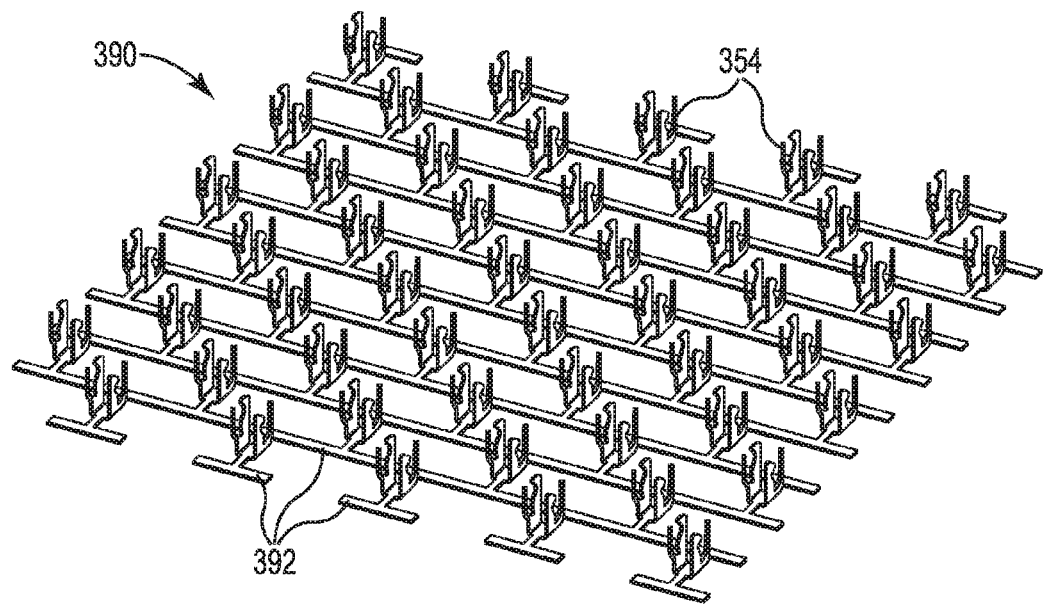
FIG. 7D is a perspective view of an array of contacts for use in the socket of FIG. 7A.

FIG. 7D illustrates an array 390 of contact members 354 stamped and formed on grid that matches the pattern of the openings 356 in the substrate 358. The contact members 354 are simultaneously engaged with the substrate 358. The portions 392 of the array 390 that hold the contact members 354 together are then removed by etching, laser cutting, or the like.

Figure 7E:
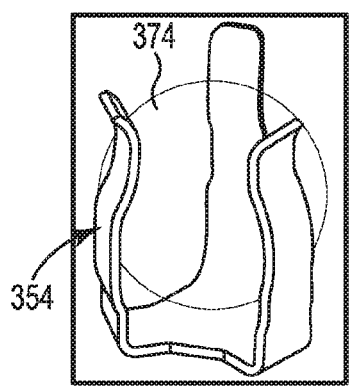
FIGS. 7E-7G illustrate alternate contacts suitable for use in the socket of FIG. 7A.
Figure 7F:
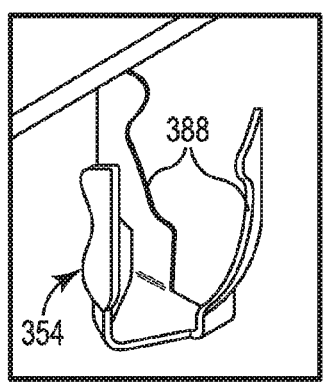
Figure 7G:
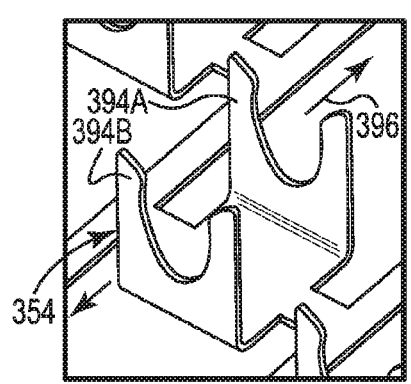

FIGS. 7E-7G illustrate alternate configurations of the contact members 354 in accordance with an embodiment of the present disclosure. FIGS. 7E and 7F illustrate embodiments with three beams 388. All of the beams 388 can flex radially outward. FIG. 7G is illustrates a folded structure with paired beams 394A, 394B, where the respective pairs 394 flex, away from each other along axis 396.

Figure 7H:
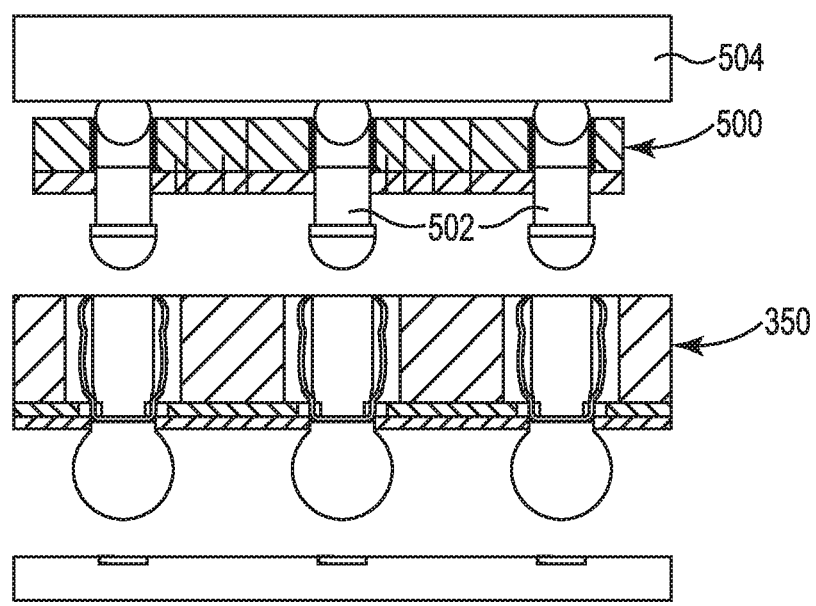
FIG. 7H is a side view of an electrical interconnect with electroplated terminals coupled to a BGA device engaged with the socket of FIG. 7A in accordance with an embodiment of the present disclosure.

FIG. 7H is a side view of an electrical interconnect 500 with electroplated terminals 502 coupled to a BGA device 504 engaged with the socket 350 of FIG. 7A in accordance with an embodiment of the present disclosure. Details of the electrical interconnect 500 are disclosed in commonly owned U.S. patent Ser. No. 14/408,039, filed Mar. 13, 2013, entitled HIGH SPEED CIRCUIT ASSEMBLY WITH INTEGRAL TERMINAL AND MATING BIAS LOADING ELECTRICAL CONNECTOR ASSEMBLY, the disclosure of which is hereby incorporated by reference.

Figure 8:
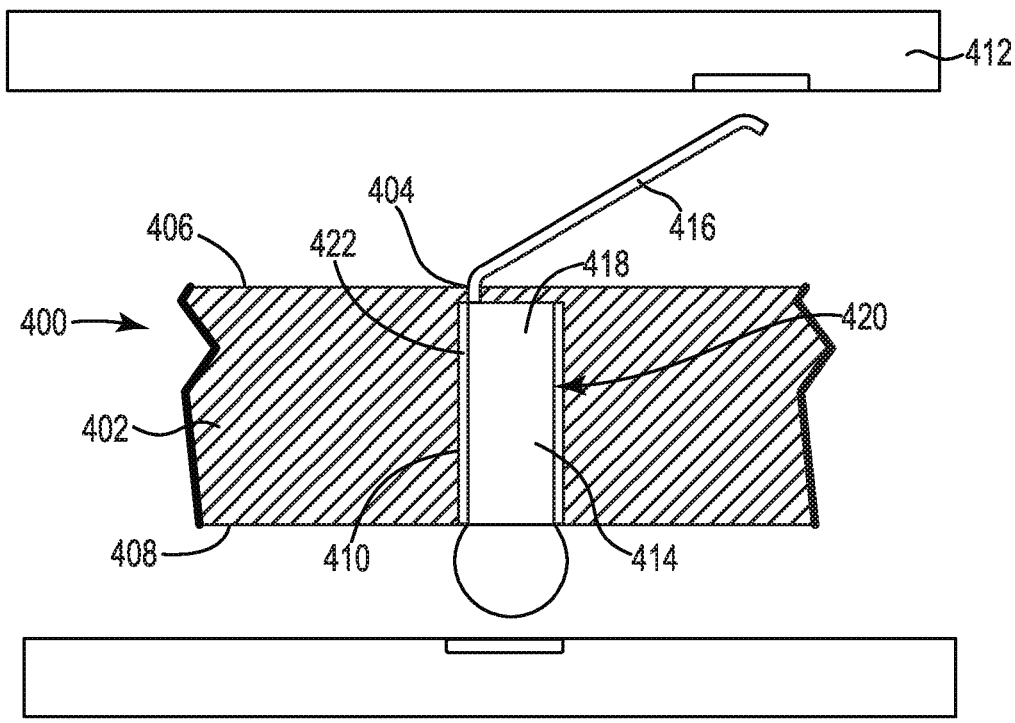
FIG. 8 is a cross sectional, view of an insulator housing for an electrical connector with a flowable contact retention region in accordance with an embodiment of the present disclosure.

FIG. 8 is a side cross-sectional view of a portion of a semiconductor socket 400 in accordance with an embodiment of the present disclosure. Substrate 402 includes an array of through holes 404 that extend from a first surface 406 to a second surface 408. Recesses 410 are formed in the second surface 408 that overlaps with the through holes 404. The substrate 402 can be configured to engage with a variety of circuit members 412, such as example, IC device 412. As used herein, the term "circuit member" refers to, for example, a packaged integrated circuit device, an unpackaged integrated circuit device, a printed circuit board, a flexible circuit, a bare-die device, an organic or inorganic, substrate, a rigid circuit, or any other device capable of carrying electrical current.

Figure 9:
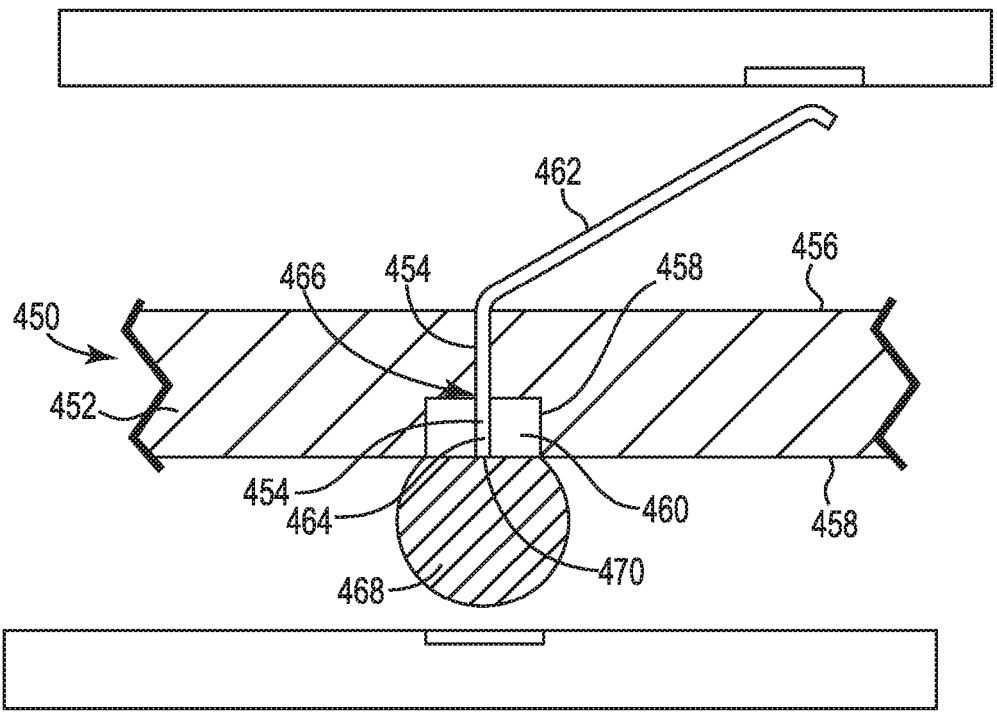
FIG. 9 is a cross sectional view of an insulator housing for an electrical connector with a printed flowable contact retention region in accordance with an embodiment of the present disclosure.

A plurality of discrete contact members 414 are inserted into recesses 410 so distal portions 416 extend out through the holes 404. In the illustrated embodiment, the distal portions 416 are simple cantilever beams located above the first surface 406. The distal portions 416 preferably have a generally uniform cross section. Proximal portions 418 of the contact members 414 are preferably configured to reside in the recesses 410. The contact members 416 can be positioned into the recesses 410 using a variety of techniques, such as for example stitching or vibratory techniques. The contact members 414 are preferably constructed of copper or similar metallic materials such as phosphor bronze or beryllium-copper. The contact members are preferably plated with a corrosion resistant metallic material, such as nickel, gold, silver, palladium, or multiple layers thereof. Semiconductor sockets such as illustrated in FIGS. 8 and 9 are disclosed in commonly-assigned U.S. patent application Ser. No. 13/319,158 entitled Semiconductor Socket, filed Jun. 15, 2010, and Ser. No. 14/408,338 entitled Semiconductor Socket with Direct Metalization, filed Mar. 14, 2013, the entire disclosures of which are hereby incorporated by reference.

In one embodiment, the entire substrate 402 is substantially constructed from a low glass transition temperature polymeric material. During reflow the polymeric material of the substrate 402 engages with the proximal portions 418. After cooling, the substrate 402 is bonded and sealed to the proximal portions 418 in the retention region 420, preventing solder 422 from wicking into the recesses 410.

In an alternate embodiment, the substrate 402 is constructed from a high glass transition temperature polymeric material and the inside surface of the recesses 410 are printed with lower glass transition polymeric material 422. During reflow the polymeric material 422 engages with the proximal portions 418.

FIG. 9 is a cross-sectional view of an interconnect assembly 450 in, accordance with an embodiment of the present disclosure. Substrate 452 includes an array of through holes 454 that extend from a first surface 456 to a second surface 458. Recesses 458 are formed in the second surface 456 that overlaps with the through holes 454.

Substrate 452 is constructed from a high glass transition temperature polymeric material. Recess 458 in the substrate 452 is filed with low glass temperature polymeric material 460. The polymeric material 460 can be molded with the substrate 452 or be deposited in the recess 458 after the substrate 452 is formed. The through holes 454 also extend through the polymeric material 460.

A plurality of discrete contact members 462 are inserted into the through holes 454. In the illustrated embodiment, the contact members 462 are simple cantilever beams without any retention features. During reflow the polymeric material 460 engages with proximal portions 464 of the contact members 462. After cooling, the substrate 452 is bonded and sealed to the proximal portions 464 in retention region 466. Solder balls 468 are printed onto the proximal end 470 of the contact member 462. The polymeric material 460 forms a seal in the retention region 466 to prevent solder 468 from wicking into the through holes 454.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need, to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiments) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making an electrical interconnector, the method comprising the steps of:
   positioning a plurality of discrete contact members in through holes in a substrate so distal portions of the contact members extend above a first surface of the substrate in a cantilevered configuration and proximal portions of the contact members are accessible along a second surface of the substrate;
   locating a flowable polymeric on the second surface of the substrate adjacent the through holes;
   subjecting the substrate and the contact members to sufficient energy and/or pressure so the flowable polymeric layer flows into engagement with the proximal portions of the contact members and fuses the contact members to the substrate;
   positioning distal portions of the contact members in through holes in an insulator housing; and
   bonding the first surface of the substrate to a first surface of the insulator housing so the distal portions are accessible from a second surface of the insulator housing.

2. The method of claim 1 wherein the flowable polymeric material fused to the contact members substantially seals the through holes in the substrate.

3. The method of claim 1 comprising forming distal portions of the contact members with a plurality of beams maintained in a cantilevered relationship with respect to the first surface of the substrate.

4. The method of claim 1 comprising forming distal portions of the contact members with a plurality of beams that elastically deform to mechanically and electrically engage with terminals on circuit members.

5. The method of claim 1 comprising positioning a layer of the flowable polymeric material on the second surface of the substrate.

6. The method of claim 5 comprising processing the flowable polymeric material to reveal the proximal portions of the contact members.

7. The method of claim 1 comprising molding the flowable polymeric material to the second surface of the substrate adjacent the through holes.

8. The method of claim 1 comprising depositing the flowable polymeric material on the second surface of the substrate adjacent the through holes.

9. The method of claim 1 selecting the flowable polymeric material from low melt liquid crystal polymer, an epoxy set resin, a thermoset material, or a thermoplastic material.

10. The method of claim 1 comprising:
    forming the substrate from a first polymeric material have a first glass transition temperature and the flowable polymeric material from a second polymeric material have a second glass transition temperature, wherein the second glass transition temperature is lower than the first glass transition temperature; and subjecting the substrate and the contact members to sufficient energy and/or pressure so the second glass transition temperature of the flowable polymeric material is exceeded, but the first glass transition temperature is not exceeded, so that the flowable polymeric material enters a molten or rubber-like state and flows into engagement with proximal portions of the contact members.

11. The method of claim 1 comprising:

electrically coupling proximal portions of the contact members to contact pads on a first circuit member;

positioning terminals on a second circuit member in the through holes along the second surface of the insulator housing; and mechanically and electrically coupling the terminals on the second circuit member with distal portions of the contact members.

12. The method of claim 1 comprising:

positioning solder ball terminals on a BOA device in the through holes along the second surface of the insulator housing; and elastically deforming distal portions of the contact members to mechanically and electrically engage with the solder ball terminals on the BOA device.

13. An electrical interconnector comprising:

a plurality of discrete contact members located in through holes in a substrate so distal portions of the contact members extend above a first surface of the substrate in a cantilevered configuration and proximal portions of the contact members are accessible along a second surface of the substrate;

a flowable polymeric material located on the second surface of the substrate is fusion bonded to the proximal portions of the contact members so the flowable polymeric material substantially seals the through holes in the substrate; and an insulator housing bonded to the first surface of the substrate with the distal portions of the contact members located in through holes in an insulator housing, so the distal portions are accessible from a second surface of the insulator housing.

14. The electrical interconnect of claim 13 wherein distal portions of the contact members comprise a plurality of beams maintained in a cantilevered relationship with respect to the first surface of the substrate.

15. The electrical interconnect of claim 13 wherein distal portions of the contact members comprise a plurality of beams that elastically deform to mechanically and electrically engage with terminals on a circuit member.

16. The electrical interconnect of claim 13 wherein the flowable polymeric material is selected from one of a low melt liquid crystal polymer, an epoxy set resin, a thermoset material, or a thermoplastic material.

17. The electrical interconnect of claim 13 wherein the substrate is formed from a first polymeric material have a first glass transition temperature and the flowable polymeric material from a second polymeric material have a second glass transition temperature, wherein the second glass transition temperature is lower than the first glass transition temperature.

18. An electrical assembly comprising:

the electrical interconnect of claim 13;

contact pads on a first circuit member electrically coupled proximal portions of the contact members;

terminals on, a second circuit member positioned in the through holes along the second surface of the insulator housing, and mechanically and electrically coupled with distal portions of the contact members.

19. An electrical assembly comprising:

the electrical interconnect of claim 13;

solder ball terminals on a BGA device positioned in the through holes along they second surface of the insulator housing, the distal portions of the contact members mechanically and electrically coupled with the solder ball terminals on the BGA device.

* * * * *